(12) United States Patent
Andrews et al.

(10) Patent No.: US 8,384,428 B1
(45) Date of Patent: Feb. 26, 2013

(54) PRE-CONFIGURATION PROGRAMMABILITY OF I/O CIRCUITRY

(75) Inventors: William B. Andrews, Macungie, PA (US); Zheng Chen, Upper Macungie, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/006,622

(22) Filed: Jan. 14, 2011

(51) Int. Cl.
*H03K 19/177* (2006.01)
*H01L 25/00* (2006.01)

(52) U.S. Cl. .......................................... 326/41; 326/38

(58) Field of Classification Search .................. None
See application file for complete search history.

(56) References Cited

U.S. PATENT DOCUMENTS

| | | |
|---|---|---|
| 6,208,162 B1 | 3/2001 | Bocchino |
| 6,480,026 B2 * | 11/2002 | Andrews et al. ............... 326/39 |
| 6,859,066 B1 | 2/2005 | Rahman et al. |
| 6,924,659 B1 | 8/2005 | Andrews et al. |
| 6,943,582 B1 | 9/2005 | Andrews et al. |
| 6,943,583 B1 | 9/2005 | Andrews et al. |
| 6,952,115 B1 | 10/2005 | Andrews et al. |
| 6,967,500 B1 | 11/2005 | Lin et al. |
| 7,215,148 B1 | 5/2007 | Johnson et al. |
| 7,262,630 B1 | 8/2007 | Andrews et al. |
| 7,518,396 B1 * | 4/2009 | Kondapalli et al. ............. 326/38 |
| 7,535,258 B1 | 5/2009 | Johnson et al. |
| 7,539,926 B1 * | 5/2009 | Lesea ........................... 714/776 |

\* cited by examiner

*Primary Examiner* — Crystal L Hammond
(74) *Attorney, Agent, or Firm* — Mendelsohn, Drucker & Associates, P.C.

(57) ABSTRACT

In one embodiment of the invention, a programmable logic device, such as an FPGA, has programmable I/O circuits that can be programmed into any one of a number of different operating modes before configuration is completed. As such, the same set of I/O circuits and corresponding I/O pads can be used to configure the device using different configuration interfaces having different interface signaling requirements. Such a device may be able to be implemented using fewer I/O pads than conventional devices that employ a different set of I/O pads for each different type of configuration interface supported by the device.

18 Claims, 3 Drawing Sheets

100

PRE-CONFIGURATION PROGRAMMABILITY OF I/O CIRCUITRY

TECHNICAL FIELD

The present invention relates to programmable logic devices, such as field-programmable gate arrays (FPGAs), and, in particular, to the input/output (I/O) interfaces for such devices.

BACKGROUND

A programmable logic device, like an FPGA, has a programmable logic core and programmable I/O circuitry that provides incoming signals to the logic core and presents outgoing signals generated by the logic core. The logic core and I/O circuitry can be programmed to support different signal-processing applications.

FPGAs and other programmable logic devices can be configured for particular signal-processing applications using external devices called configuration interfaces. Some FPGAs are capable of being configured with a variety of different types of configuration interfaces, where each different type of configuration interface may have its own unique set of interface signaling requirements that dictate the characteristics of the I/O circuits on the FPGA that receive signals from and provide signals to the configuration interface. In a conventional FPGA, a different set of I/O circuits are designated for each different type of configuration interface that the FPGA supports. Each of these I/O circuits may be programmable to (i) support the corresponding configuration interface before configuration of the FPGA is completed and (ii) provide any of one or more different programmable operating modes after the FPGA has been configured.

In particular, I/O control circuitry in the I/O circuit of a conventional FPGA may have one or more (2×1) multiplexers (muxes), each of which receives (i) a hard-wired mode-control signal value (i.e., either a 1 or a 0) at one of the mux inputs, (ii) a configurable mode-control signal value from the FPGA's configuration memory at the other mux input, and (iii) a global output enable (GOE) signal from the FPGA's configuration controller as the mux selection-control signal, where the GOE signal indicates whether or not configuration of the FPGA has been completed. For example, when the GOE signal is low (indicating that FPGA configuration has not been completed), then the mux outputs the hard-wired mode-control signal value to the rest of the I/O circuitry for use in programming the I/O circuit to interface with the external configuration interface currently being used to configure the FPGA. When the GOE signal is high (indicating that FPGA configuration has been completed), then the mux outputs the configurable mode-control signal value (that was set during FPGA configuration) to the rest of the I/O circuitry for use in programming the I/O circuit for post-configuration operations.

Because different configuration interfaces have different interface signaling requirements, a different set of I/O circuits, and therefore a different set of I/O pads on the FPGA, may be required to support each different configuration interface, which can increase the number of I/O pads that need to be part of the FPGA design, thereby increasing the cost of the device.

SUMMARY

In order to reduce the number of I/O pads in an FPGA, the I/O control circuitry of certain I/O circuits associated with certain I/O pads is designed to enable the I/O circuits to be programmed in any one of two or more different operating modes prior to the completion of device configuration. This enables an individual I/O circuit to be used to support configuration of the FPGA using different types of external configuration interfaces, even when those different configuration interfaces have different sets of configuration signaling requirements.

In one embodiment, the present invention is a programmable logic device comprising programmable I/O circuitry, a programmable logic core, configuration memory, and a configuration controller. The programmable I/O circuitry has a plurality of programmable I/O circuits connected to corresponding I/O pads. The programmable logic core is connected to receive incoming signals from and provide outgoing signals to the I/O circuitry. The configuration memory is connected to store configuration data for programming the I/O circuitry and the logic core. The configuration controller is adapted to support configuration of the programmable logic device by an external configuration interface. At least one programmable I/O circuit comprises I/O component circuitry and I/O control circuitry. The I/O component circuitry is adapted to receive incoming signals from and provide outgoing signals to a corresponding I/O pad of the programmable logic device. The I/O control circuitry is adapted to program the I/O circuit into any one of a plurality of different operating modes prior to completion of the configuration of the programmable logic device by the configuration interface.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
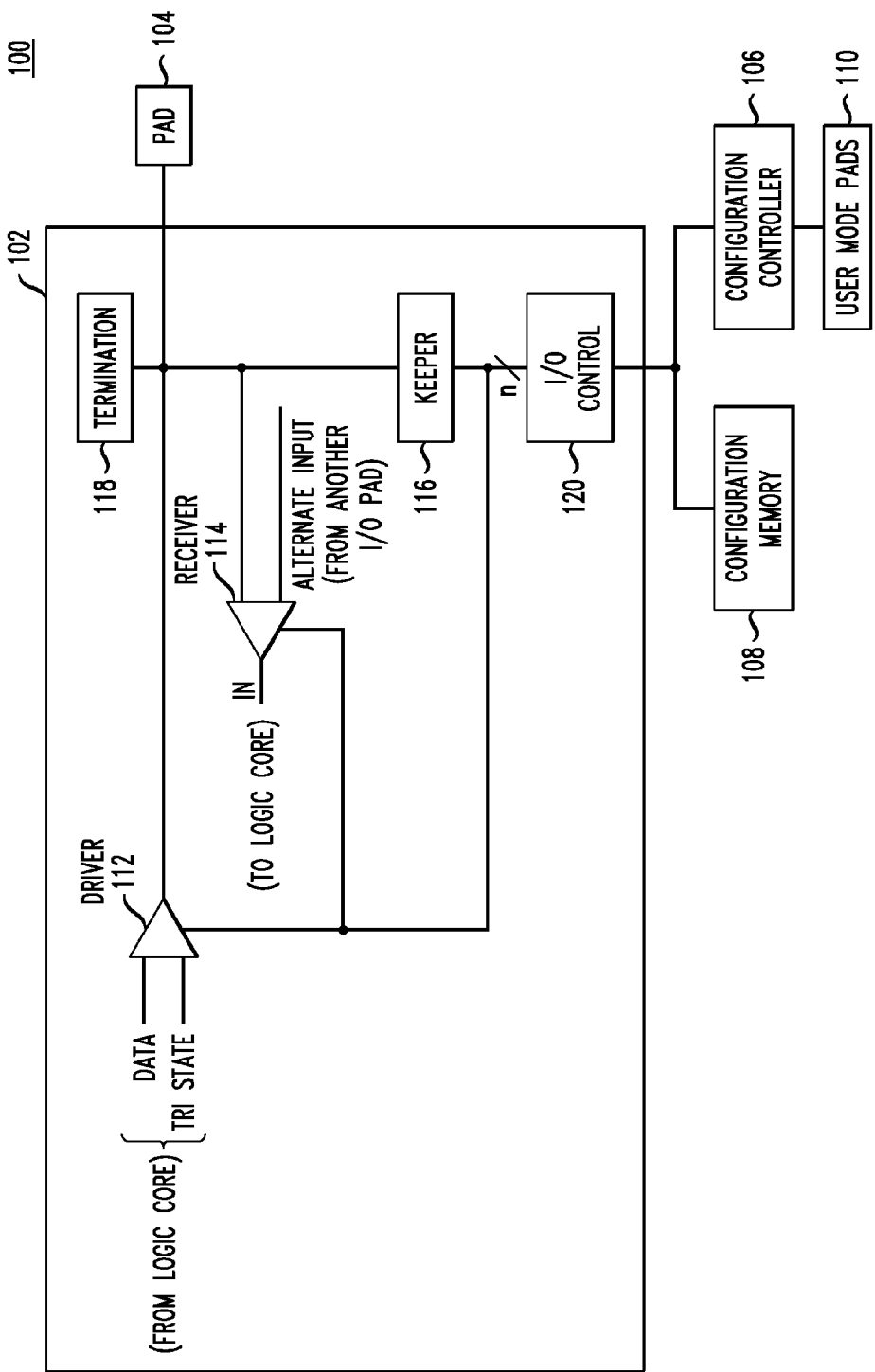
FIG. 1 shows a block diagram of a portion of a field-programmable gate array, according to one embodiment of the present invention.

FIG. 1 shows a block diagram of a portion of a field-programmable gate array 100, according to one embodiment of the present invention. In particular, FIG. 1 shows programmable I/O circuit 102, corresponding I/O pad 104, configuration controller 106, configuration memory 108, and user mode pads 110. FPGA 100 would typically have many additional instances of similar programmable I/O circuits and corresponding I/O pads, some or all of which would also be connected to configuration memory 108 and/or configuration controller 106.

As shown in FIG. 1, I/O circuit 102 includes output driver 112, input receiver 114, keeper circuit 116, and termination circuit 118, each of which is connected to I/O pad 104 and one or more of which are also connected to I/O control circuit 120. In the particular implementation shown in FIG. 1, each of output driver 112, input receiver 114, keeper circuit 116, and termination circuit 118 is connected to I/O control circuit 120. In other implementations, one or more of these I/O circuit components are not connected to I/O control circuit 120.

In general, each I/O circuit component that is connected to I/O control circuit 120 is a programmable circuit component that can be programmed by I/O control circuit 120 to operate or support operations in any of two or more different I/O operating modes. For example, output driver 112 may be a programmable output driver that can be programmed by I/O control circuit 120 to operate in any one of push pull mode, open drain mode, or differential mode. Output driver 112 can also have multiple drive settings, slew rates, and/or clamp characteristics.

Similarly, input receiver 114 may be a programmable input receiver that can be (independently) programmed by I/O control circuit 120 to operate in different modes. Input receiver 114 can be single ended or differential and have different input switch points, hysteresis, and/or tolerance levels. For example, input receiver 114 can be programmed with or without hysteresis, where hysteresis can be programmed with different levels (e.g., 250 mV, 500 mV) per I/O circuit. Input receiver 114 can also have the clamp to its power supply programmably turned off or on. In addition, input receiver 114 has weak pull up and pull down resistors that can be programmably turned on or off.

Keeper circuit 116 may also be a programmable circuit that can be (independently) programmed by I/O control circuit 120 to operate in any one of pull up mode, pull down mode, or tristate (i.e., latch) mode, where those different keeper-circuit modes might have different programmable strengths and different dependencies on environmental conditions such as voltage. One function of keeper circuit 116 is to prevent I/O pad 104 from floating at an indeterminate voltage level.

Lastly, termination circuit 118 may be a programmable termination circuit that can be (independently) programmed by I/O control circuit 120 to provide any one of a number of different levels of output impedance at I/O pad 104.

U.S. Pat. Nos. 6,480,026 (Andrews et al.), 6,859,066 (Rahman et al.), 6,924,659 (Andrews et al.), 6,943,582 (Andrews et al.), 6,943,583 (Andrews et al.), 6,952,115 (Andrews et al.), 6,967,500 (Lin et al.), 7,215,148 (Johnson et al.), 7,262,630 (Andrews et al.), and 7,535,258 (Johnson et al.), the teachings of all of which are incorporated herein by reference in their entirety, describe examples of programmable I/O components that enable I/O circuits, like I/O circuit 102 of FIG. 1, to be programmed to operate in any one of a plurality of different I/O operating modes.

Figure 2:
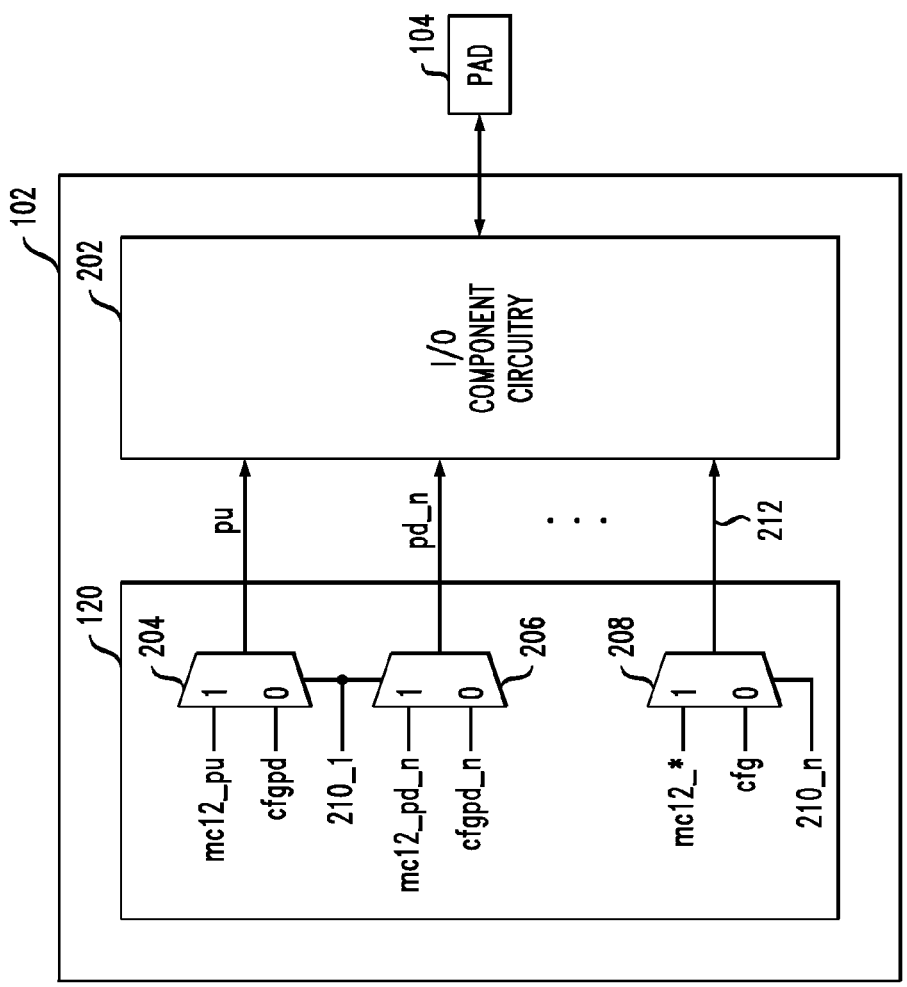
FIG. 2 shows another representation of the I/O circuit shown in FIG. 1.

FIG. 2 shows another representation of I/O circuit 102 of FPGA 100 of FIG. 1. In FIG. 2, output driver 112, input receiver 114, keeper circuit 116, and termination circuit 118 of FIG. 1 are shown collectively as I/O component circuitry 202. FIG. 2 represents one possible implementation of I/O control circuit 120 of FIG. 1. In particular, in FIG. 2, I/O control circuit 120 has n different sets of one or more (2×1) muxes, where the first set has muxes 204 and 206, and the nth set has mux 208. Each different mux set is controlled by a different corresponding mux selection-control signal 210_*i*. In addition to its control port, each mux has two input ports and one output port, where the mux selection-control signal 210_*i* applied to the control port determines whether the signal applied to the first input port or the signal applied to the second input port is presented at the mux output port.

In FIG. 2, the first (i.e., upper) input port of each mux receives its input signal from configuration memory 108 of FIG. 1, while the second (i.e., lower) input port of each mux receives its input signal from configuration controller 106 of FIG. 1. In addition, each mux selection-control signal 210_*i* is also provided by configuration controller 106. When mux selection-control signal 210_*i* is high (e.g., logic 1), the corresponding mux presents the signal applied to its first input port from configuration memory 108 at the mux output port. On the hand, when mux selection-control signal 210_*i* is low (e.g., logic 0), each corresponding mux presents the signal applied to its second input port from configuration controller 106 at the mux output port.

The signals applied to the mux input ports from configuration memory 108 and configuration controller 106 are I/O mode-control signals that control the programmable operating mode of I/O circuit 102. As such, the n sets of I/O mode-control signals presented at the output ports of the n sets of muxes in I/O control circuit 120 are applied to I/O component circuitry 202 to program I/O circuit 102 to operate in one or more of its plurality of different possible operating modes. For example, the signals presented by muxes 204 and 206 may be used to program keeper circuit 116 of FIG. 1 to operate in any of the four different operating modes represented in Table I. In particular, when I/O mode-control signals pu and pd_n are both low, keeper circuit 116 is programmed to operate in weak pull down mode. The other three combinations of I/O mode-control signals pu and pd_n enable keeper circuit 116 to be programmed in either weak pull up mode, bus hold mode, or off mode. Note that the suffix "_n" implies that the corresponding mode-control signal is active low.

TABLE I

Keeper Circuit Operating Modes

| pu | pd_n | Keeper Mode |
|---|---|---|
| 0 | 0 | Weak Pull Down |
| 1 | 0 | Off |
| 1 | 1 | Weak Pull Up |
| 0 | 1 | Bus Hold |

Other sets of muxes in I/O control circuit 120 (not shown in FIG. 2) selectively apply other mode-control signals to I/O component circuitry 202 to program one or more of output driver 112, input receiver 114, and termination circuit 118 in any of their different operating modes. For example, signal 212 from mux 208 may be used, perhaps with other I/O mode-control signals from other muxes, to determine whether output driver 112 operates as a push pull driver, an open drain driver, or part of a differential driver with the output driver of another I/O circuit.

Figure 3:
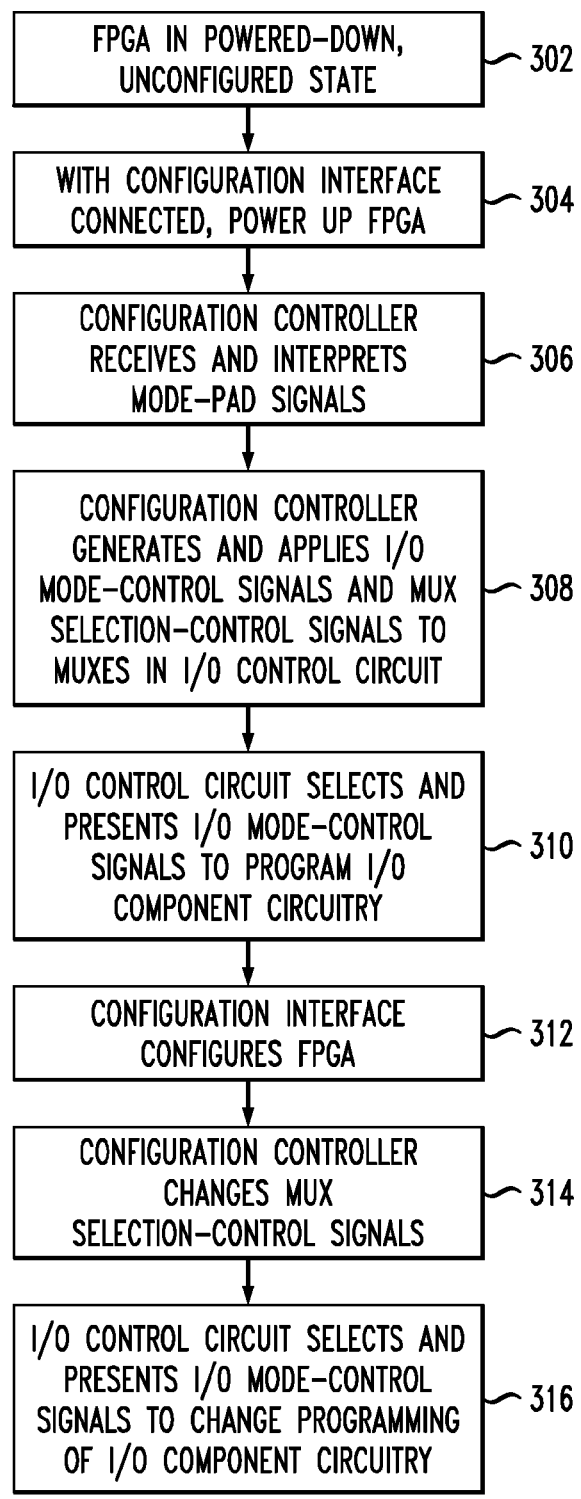
FIG. 3 shows a flow diagram of one possible sequence of operating FPGA 100 of Figs. A and B.

FIG. 3 shows a flow diagram of one possible sequence of operating FPGA 100 of Figs. A and B.

At the start of the sequence in FIG. 3 (i.e., step 302), FPGA 100 is initially in a powered-down, unconfigured state. With an external configuration interface connected, FPGA 100 is powered up (step 304).

Assume, for example, that FPGA 100 can be configured using any of up to eight different types of configuration interfaces, each with its own unique set of interface signaling requirements. In that case, FPGA 100 might have three special I/O pads referred to as user mode pads 110 that can be connected to any one of the eight different types of configuration interface, where the configuration interface applies, to the three user mode pads, a three-bit signal that identifies the type of the configuration interface based on a known mapping between the eight different possible three-bit signals and the eight different types of configuration interfaces.

Configuration controller 106 of FIG. 1 receives and interprets the mode-pad signals from the configuration interface to determine what type of configuration interface it is (step 306). Configuration controller 106 is specifically designed to generate and apply, to the lower input ports of the muxes in I/O control circuit 120 of FIG. 2 (and every other I/O control circuit for each other I/O circuit corresponding to an I/O pad connected to the configuration interface), an appropriate set of I/O mode-control signals corresponding to the interface signaling requirements for the particular type of configuration interface (step 308). At the same time, configuration controller 106 sets the mux selection-control signals 210_*i* to logic 0 to select the I/O mode-control signals applied to the muxes' lower input ports (step 308). By design, each I/O circuit has a default state, that can vary from I/O circuit to I/O circuit. The design also prevents timing issues and prevents multiple input legs of any mux from being on at the same time. As a result, the muxes in I/O control circuit 120 present, to I/O component circuitry 202 of FIG. 2, the I/O mode-control signals corresponding to the particular configuration interface and, in turn, I/O component circuitry 202 is programmed to support the interface signaling requirements of the particular configuration interface (step 310).

With I/O circuit 102 (and the other I/O control circuits) appropriately programmed, the configuration interface is now able to configure FPGA 100 (step 312), which, among other things, involves storing configuration data to configuration memory 108 of FIG. 1, which, in turn, results in some of that stored configuration data being applied to the upper input ports of the muxes in I/O control circuit 120. After configuration of FPGA 100 is completed, configuration controller 106 changes the values of mux selection-control signals 210_*i* from logic 0 to logic 1 (step 314) to cause I/O control circuit 120 to select the I/O mode-control signals from configuration memory 108, rather than the I/O mode-control signals from configuration controller 106 (step 316), thereby changing the programming of I/O component circuitry 202 to support the particular application to which FPGA 100 was configured. In this way, I/O component circuitry 202 can be programmed in one operating mode before configuration of FPGA 100 is complete and another, different operating mode after the FPGA's configuration has been completed.

In addition, by applying a different set of signals to the mode pads, the exact same set of I/O pads used to support configuration of FPGA 100 using one type of configuration interface can be used to support configuration of FPGA 100 using any of the other seven types of configuration interfaces in this particular example.

Moreover, in certain implementations, configuration controller 106 is able to independently generate each different mux selection-control signal 210_*n*. As such, at any given time, one or more of the I/O mode-control signals applied to I/O component circuitry 202 can be provided by configuration memory 108, while one or more other I/O mode-control signals that are applied to I/O component circuitry 202 can be provided by configuration controller 106. This also means that the programming of I/O component circuitry 202 can be changed one or more times during FPGA configuration as more and more data is stored in configuration memory 108. The ability to change the programming of I/O component circuitry 202 on the fly is useful if one mode has a higher priority than another. A higher-priority configuration mode can interrupt a current interface and take charge of configuration or reset the interface and start a new configuration using the new mode. This flexibility provided by configuration controller 106 and I/O control circuit 120 can also be exploited during any subsequent re-configuration of FPGA 100 following the initial configuration that accompanies initial power up of the FPGA.

Although the present invention has been described in the context of FPGAs, those skilled in the art will understand that the present invention can be implemented in the context of other types of programmable logic devices (PLDs), such as, without limitation, mask-programmable gate arrays (MP-GAs), simple programmable logic devices (SPLDs), and complex programmable logic devices (CPLDs). More generally, the present invention can be implemented in the context of any kind of electronic device having programmable elements.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A programmable logic device comprising:
   programmable input/output (I/O) circuitry having a plurality of programmable I/O circuits connected to corresponding I/O pads;
   a programmable logic core connected to receive incoming signals from and provide outgoing signals to the I/O circuitry;
   configuration memory connected to store configuration data for programming the I/O circuitry and the logic core; and
   a configuration controller adapted to support configuration of the programmable logic device by an external configuration interface,
   wherein at least one programmable I/O circuit comprises:
      I/O component circuitry adapted to receive incoming signals from and provide outgoing signals to a corresponding I/O pad of the programmable logic device; and
      I/O control circuitry responsive to the configuration controller to program the I/O circuit on power up into a first I/O operating mode for receiving the configuration data from the configuration interface and storing the data into the configuration memory and then into a second I/O operating mode based on the stored configuration data.

2. The invention of claim 1, wherein the I/O component circuitry comprises:
   an output driver adapted to apply an output signal at the corresponding I/O pad;
   an input receiver adapted to receive an input signal applied to the I/O pad;
   a keeper circuit adapted to prevent voltage level at the I/O pad from floating; and
   termination circuitry adapted to apply a termination impedance to the I/O pad.

3. The invention of claim 1, wherein the I/O control circuitry is further responsive to the configuration controller to change the first I/O operating mode of the I/O circuit multiple times before the receiving and storing of the configuration data is complete.

4. The invention of claim 1, wherein the I/O control circuitry is adapted to selectively apply, to the I/O component circuitry, (i) I/O mode-control signals received from the configuration memory or (ii) I/O mode-control signals received from the configuration controller, to control the operating mode of the I/O circuit.

5. The invention of claim 4, wherein the I/O control circuitry receives one or more selection-control signals from the configuration controller to control the selection of the I/O mode-control signals.

6. The invention of claim 5, wherein the configuration controller is adapted to generate and apply multiple selection-control signals to the I/O control circuit to enable one or more I/O mode-control signals received from the configuration memory and one or more I/O mode-control signals received from the configuration controller to be simultaneously selected to control the operating mode of the I/O circuit.

7. The invention of claim 1, wherein different operating modes for the I/O circuit comprise two or more of pull up mode, pull down mode, and tristate mode.

8. The invention of claim 1, wherein different operating modes for the I/O circuit comprise different pull mode strengths.

9. The invention of claim 1, wherein different operating modes for the I/O circuit comprise two or more of push pull mode, open drain mode, and differential mode.

10. The invention of claim 1, wherein the I/O control circuitry enables the I/O circuit to be programmed in different operating modes corresponding to different configuration interfaces such that the I/O circuit can be programmed to support the configuration of the programmable logic device via the corresponding I/O pad using any one of the different configuration interfaces.

11. The invention of claim 1, wherein the I/O control circuitry comprises at least one multiplexer connected to receive (i) an I/O mode-control signal from the configuration memory, (ii) an I/O mode-control signal from the configuration controller and (iii) a selection-control signal from the configuration controller and to output one of the I/O mode-control signals based on the value of the I/O selection-control signal, wherein the selected I/O mode-control signal is used in programming the I/O circuit into one of the plurality of operating modes.

12. The invention of claim 11, wherein the I/O control circuitry comprises a plurality of said multiplexers, wherein:
   at least two multiplexers are connected to receive different I/O selection-control signals from the configuration controller; and
   the configuration controller is adapted to independently and simultaneously generate the different I/O selection-control signals such that a first multiplexer selects the corresponding I/O mode-control signal from the configuration memory and a second multiplexer selects the corresponding I/O mode-control signal from the configuration controller.

13. The invention of claim 1, wherein signals, applied to a plurality of user mode pads of the programmable logic device by the configuration interface, identify interface signaling requirements to be supported by I/O circuits corresponding to other I/O pads connected to the configuration interface.

14. The invention of claim 13, wherein the configuration controller generates and applies, to the I/O control circuit, I/O mode-control signals corresponding to the interface signaling requirements of the configuration interface.

15. The invention claim 1, wherein a single set of I/O pads are used to configure the programmable logic device using any of a plurality of different types of external configuration interfaces having different sets of interface signaling requirements.

16. The invention of claim 1, wherein the programmable logic device is a field-programmable gate array (FPGA).

17. The invention of claim 1, wherein:
   the I/O control circuitry is further adapted to program the operating mode of the I/O circuit after the completion of the configuration of the programmable logic device based on the configuration data stored in the configuration memory;
   the operating mode of the I/O circuit after the completion of the configuration of the programmable logic device is different from the operating mode of the I/O circuit before the completion of the configuration of the programmable circuit;
   the I/O control circuitry is adapted to change the operating mode of the I/O circuit multiple times before the completion of the configuration of the programmable logic device;
   the I/O control circuitry is adapted to selectively apply, to the I/O component circuitry, (i) I/O mode-control signals received from the configuration memory or (ii) I/O mode-control signals received from the configuration controller, to control the operating mode of the I/O circuit;

the I/O control circuitry receives one or more selection-control signals from the configuration controller to control the selection of the I/O mode-control signals;

the configuration controller is adapted to generate and apply multiple selection-control signals to the I/O control circuit to enable one or more I/O mode-control signals received from the configuration memory and one or more I/O mode-control signals received from the configuration controller to be simultaneously selected to control the operating mode of the I/O circuit;

the I/O control circuitry enables the I/O circuit to be programmed in different operating modes corresponding to different configuration interfaces such that the I/O circuit can be programmed to support the configuration of the programmable logic device via the corresponding I/O pad using any one of the different configuration interfaces;

the I/O control circuitry comprises at least one multiplexer connected to receive (i) an I/O mode-control signal from the configuration memory, (ii) an I/O mode-control signal from the configuration controller and (iii) a selection-control signal from the configuration controller and to output one of the I/O mode-control signals based on the value of the I/O selection-control signal, wherein the selected I/O mode-control signal is used in programming the I/O circuit into one of the plurality of operating modes;

the I/O control circuitry comprises a plurality of said multiplexers, wherein:

at least two multiplexers are connected to receive different I/O selection-control signals from the configuration controller; and the configuration controller is adapted to independently and simultaneously generate the different I/O selection-control signals such that a first multiplexer selects the corresponding I/O mode-control signal from the configuration memory and a second multiplexer selects the corresponding I/O mode-control signal from the configuration controller;

signals, applied to a plurality of user mode pads of the programmable logic device by the configuration interface, identify interface signaling requirements to be supported by I/O circuits corresponding to other I/O pads connected to the configuration interface;

the configuration controller generates and applies, to the I/O control circuit, I/O mode-control signals corresponding to the interface signaling requirements of the configuration interface;

a single set of I/O pads are used to configure the programmable logic device using any of a plurality of different types of external configuration interfaces having different sets of interface signaling requirements; and the programmable logic device is a field-programmable gate array (FPGA).

18. A method of configuring a programmable logic device (PLD) comprising:

powering up the PLD;

receiving and interpreting within the PLD mode-pad signals that identify a type of configuration interface connected to the PLD;

programming an I/O circuit of the PLD into a first I/O operating mode for receiving configuration data from the identified configuration interface;

receiving the configuration data through the I/O circuit and storing the data within configuration memory of the PLD; and reprogramming the I/O circuit into a second I/O operating mode based on the stored configuration data.

\* \* \* \* \*